(12) United States Patent  
Kalburge

(10) Patent No.: US 7,871,851 B2  
(45) Date of Patent: Jan. 18, 2011

(54) METHOD FOR INTEGRATING NANOTUBE DEVICES WITH CMOS FOR RF/ANALOG SOC APPLICATIONS

(75) Inventor: Amol M. Kalburge, Irvine, CA (US)

(73) Assignee: RF Nano, Newport Beach, CA (US)

( * ) Notice: Subject to any disclaimer, the term of this patent is extended or adjusted under 35 U.S.C. 154(b) by 339 days.

(21) Appl. No.: 12/124,846

(22) Filed: May 21, 2008

(65) Prior Publication Data

US 2008/0290418 A1  Nov. 27, 2008

Related U.S. Application Data

(60) Provisional application No. 60/940,338, filed on May 25, 2007.

(51) Int. Cl.  
*H01L 21/00* (2006.01)

(52) U.S. Cl. .................. 438/82; 438/99; 438/200

(58) Field of Classification Search ............ 438/82, 438/99, 200  
See application file for complete search history.

(56) References Cited

U.S. PATENT DOCUMENTS

| | | | |
|---|---|---|---|
| 6,830,967 B1 | 12/2004 | Yin | |
| 2006/0038167 A1 | 2/2006 | Hakey et al. | |
| 2007/0102747 A1 | 5/2007 | Chen et al. | |
| 2007/0197010 A1* | 8/2007 | Hakey et al. | 438/590 |
| 2009/0114903 A1* | 5/2009 | Kalburge | 257/24 |

FOREIGN PATENT DOCUMENTS

| | | |
|---|---|---|
| KR | 10-2006-0029547 A | 4/2006 |
| KR | 10-2007-0032389 | 3/2007 |

OTHER PUBLICATIONS

Brock et al, "Carbon Nanotube Memories and Fabrics in a Radiation Hard Semiconductor Foundry", p. 1-9 (2005).  
Tseng et al, Nano Letters 4(1), 123 (2004).  
Form PCT/ISA/210 in connection with PCT/US2008/064542 dated May 26, 2009.  
Form PCT/ISA/237 in connection with PCT/US2008/064542 dated May 26, 2009.

* cited by examiner

*Primary Examiner*—Thien F Tran  
(74) *Attorney, Agent, or Firm*—Bradley D. Blanche; Greenberg Traurig LLP

(57) ABSTRACT

A method is provided of integrating the formation of nanotube devices on the same substrate or wafer as CMOS devices in a standard CMOS process. During a CMOS formation process, a region of the substrate containing CMOS devices is protected from certain nanotube fabrication processes while fabricating nanotube devices on the substrate. After fabrication of the nanotube devices, the region of the substrate containing the fabricated nanotube devices is then protected from certain CMOS fabrication processes while fabricating CMOS devices on a different region of the same substrate. Through this formation method, a nanotube device based RF/analog system-on-chip (SoC) application can be formed having the superior RF/analog properties of nanotube electronic circuitry and the superior digital properties of silicon CMOS circuitry on the same wafer or substrate.

10 Claims, 4 Drawing Sheets

Figure 1:
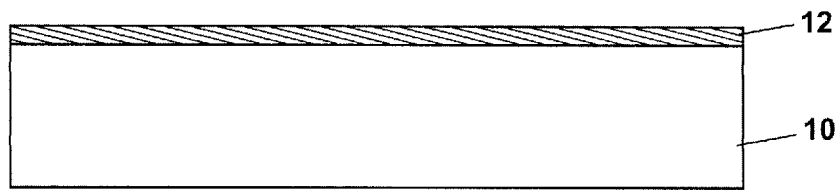
Figure 2:
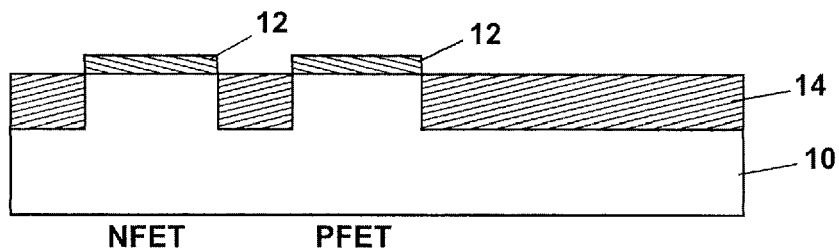

METHOD FOR INTEGRATING NANOTUBE DEVICES WITH CMOS FOR RF/ANALOG SOC APPLICATIONS

RELATED APPLICATIONS

This application claims the benefit of and priority to U.S. Provisional Application Ser. No. 60/940,338, filed May 25, 2007, the contents of which are incorporated by reference herein in its entirety.

TECHNICAL FIELD

This disclosure relates generally to system-on-chip (SoC) applications and, more particularly, to a method for integrating carbon nanotube (CNT) devices with complementary metal oxide semiconductor (CMOS) process technology on the same substrate.

BACKGROUND

One of the challenges facing broad commercialization of nanotube technology is the lack of a clear path for integrating carbon nanotubes (CNTs) with standard CMOS devices. There have been prior attempts to use nanoelectromechanical switches (NEMS) for non-volatile memory applications where such nanotube-based NEMS devices were fabricated in a silicon manufacturing plant using standard fabrication equipment. However, such prior silicon fabrication approaches of manufacturing NEMS or CNT-based switches did not integrate CNT devices with silicon CMOS devices on the same wafer.

There have also been attempts at integrating nanotube FETs with nMOS (n-channel metal oxide semiconductor) technology. However, such integration techniques with nMOS processes deviated from standard CMOS processes having both nMOS and pMOS (p-channel metal oxide semiconductor) regions and required deep poly backside gate contacts and buried, under-oxide, source/drain regions. Such techniques for integrating CNT devices with an nMOS flow were uniquely tailored to CNT device fabrication and quite different from the standard CMOS process technology.

SUMMARY

According to a feature of the disclosure, a method is provided for integrating nanotube devices with a standard CMOS process flow to integrate nanotube devices with complementary metal oxide semiconductor (CMOS) devices on the same substrate.

In one or more embodiments, a method is provided of integrating the formation of nanotube devices on the same substrate or wafer as CMOS devices in a standard CMOS process. During a CMOS formation process, a region of the substrate containing CMOS devices is protected from certain nanotube fabrication processes while fabricating nanotube devices on the substrate. After fabrication of the nanotube devices, the region of the substrate containing the fabricated nanotube devices is then protected from certain CMOS fabrication processes while fabricating CMOS devices on a different region of the same substrate.

In one or more embodiments, a method for integrating the formation of nanotube devices on the same substrate as CMOS devices includes initially forming NFET and PFET wells in a CMOS region of the substrate using CMOS masking and implantation steps. A gate oxide layer and CMOS gates are then formed over the NFET and PFET wells using known CMOS process technologies, where CMOS spacer material is deposited over the upper surface of the structure at this point in the formation process. A photoresist or other protective material is then formed over the CMOS region while leaving a region where nanotube devices are to be formed open. The CMOS spacer material is then removed from the nanotube region that was not covered by the photoresist. The photoresist is then removed from the CMOS region and layers of nanotubes and a nanotube gate dielectric are sequentially deposited over the over the upper surface of the structure. A nanotube gate electrode layer is then deposited over the upper surface of the structure and patterned to form nanotube gate electrodes over the nanotube region of the substrate. A layer of nanotube spacer material is then deposited at least over the nanotube gate electrodes and etched to form spacers on the side surfaces of the nanotube gate electrodes. A photoresist or other protective material is then formed over the entire nanotube region to protect the devices formed in the nanotube region from subsequent procedures. The layers of nanotubes and the nanotube gate dielectric above the CMOS region is then removed, and the CMOS spacer material is selectively etched to form spacers on the sides of the CMOS gates. The photoresist is also removed from the nanotube region at this point. Source and drain regions are then formed in the NFET and PFET devices of the CMOS region, and salicide layers are deposited over the surfaces of the CMOS gates and the nanotube gate electrodes. Through this formation method, a nanotube device based RF/analog system-on-chip (SoC) application can be formed having the superior RF/analog properties of nanotube electronic circuitry and the superior digital properties of silicon CMOS circuitry on the same wafer or substrate.

DRAWINGS

The above-mentioned features and objects of the present disclosure will become more apparent with reference to the following description taken in conjunction with the accompanying drawings wherein like reference numerals denote like elements and in which:

FIGS. 1-14 illustrate cross-sectional views of various stages a method of integrating nanotube devices with a standard CMOS process flow to integrate nanotube devices with CMOS devices on the same substrate in accordance with one or more embodiments of the present disclosure.

DETAILED DESCRIPTION

The present disclosure is directed to a method for integrating nanotube devices with a standard complementary metal oxide semiconductor (CMOS) process flow to integrate the formation of nanotube devices with CMOS devices on the same substrate.

In one or more embodiments described herein, for ease of description, nanotube devices may be described as carbon nanotubes (CNTs), while it is understood that the nanotube devices may comprise any type of nanotubes, including but not limited to carbon nanotubes (CNTs), single walled nanotubes (SWNTS) and multiwalled nanotubes (MWNTs). Further, each of the various embodiments could also be implemented in any 1-D semiconductor device (e.g., nanotubes, nanowires, etc.) or 2-D semiconductor device (e.g., graphene-based devices, etc.).

Referring now to FIGS. 1-14, cross-sectional views of various stages of a method of integrating nanotube devices with a standard CMOS process flow to integrate the formation of nanotube devices with CMOS devices on the same substrate in accordance with one or more embodiments of the present disclosure. Initially, as illustrated in FIG. 1, layers of oxide and/or nitride 12 are formed on a wafer or substrate 10, where substrate 10 may comprise a p-type (P-Si) wafer or other type of wafer typically used in CMOS processes. A photoresist material is then deposited on the surface of the oxide/nitride layer(s) 12 and patterned. In one or more embodiments, the photoresist material may include but is not limited to standard i-line resists (e.g., SPR-955), deep ultra violet (DUV) resists (e.g., UV5 or UV1100) or any other suitable photoresist material. The oxide/nitride layer(s) 12 and the substrate 10 are etched in the areas not protected by the photoresist material, and an oxide 14 is deposited in the etched areas. In one or more embodiments, the oxide 14 may be a thick oxide of approximately 500 nm. A polishing procedure, such as shallow trench isolation chemical mechanical polishing (STI CMP), is performed to smooth the upper surface of the structure, resulting in the structure illustrated in FIG. 2.

Figure 3:
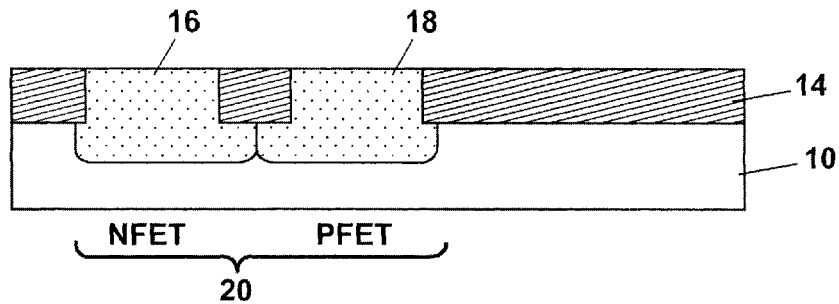
Figure 4:
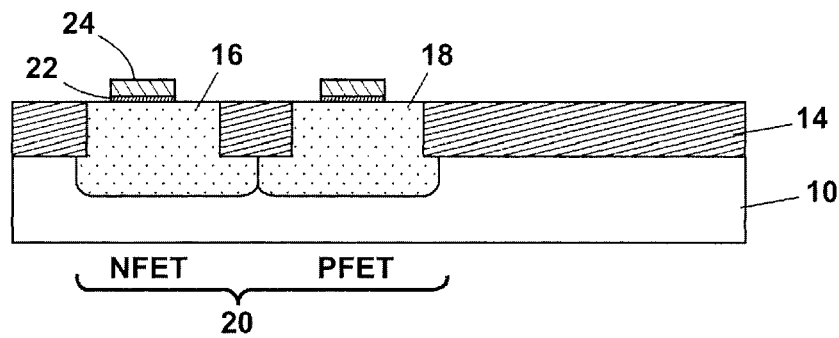
Figure 5:
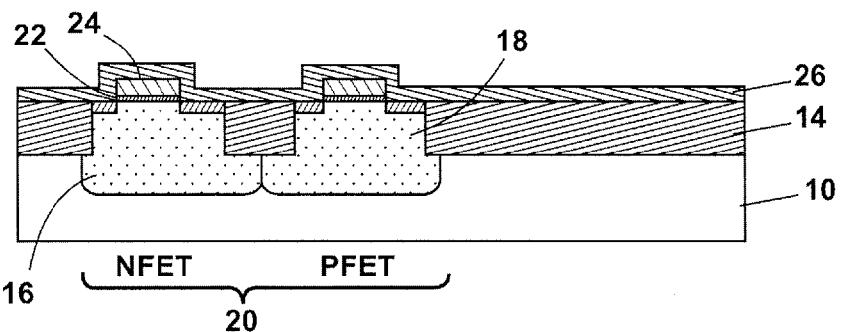

Referring now to FIG. 3 in accordance with one or more embodiments, NFET 16 and PFET 18 wells are then formed in a CMOS region 20 of the substrate 10 using conventional CMOS masking and implantation steps. A gate oxide layer 22 and CMOS gates 24 are then formed over the NFET 16 and PFET 18 wells using CMOS processes known to those skilled in the art, resulting in the structure illustrated in FIG. 4. A layer of CMOS spacer 26 is then is deposited over the upper surface of the structure at this point in the formation process, as illustrated in FIG. 5. The process steps described above in association with FIGS. 1-5 are standard CMOS process steps known to those skilled in the art.

Figure 6:
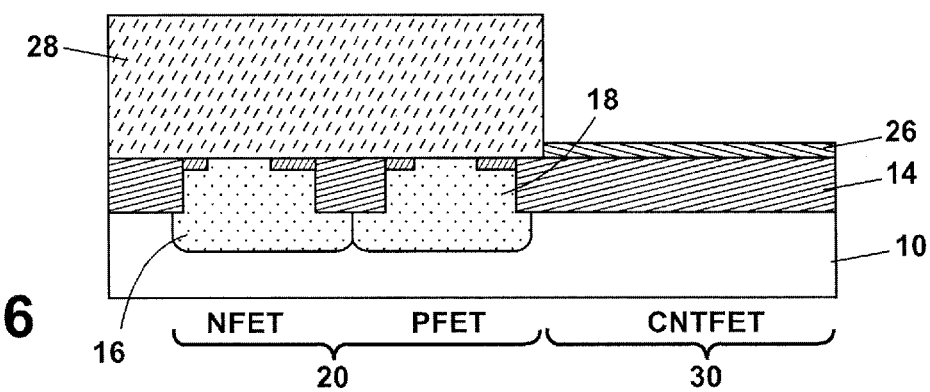

In one or more embodiments, the following process steps are next performed in order to integrate the formation of CNTs with the standard CMOS process flow. Referring to FIG. 6, a photoresist 28 or other protective material is then formed over the CMOS region 20 while leaving a nanotube region 30 where nanotube devices are to be formed left uncovered by the photoresist 28. The CMOS spacer material 26 is then removed from the nanotube region 30 that was not covered by the photoresist 28. The photoresist 28 is then removed from the CMOS region 20.

Figure 7:
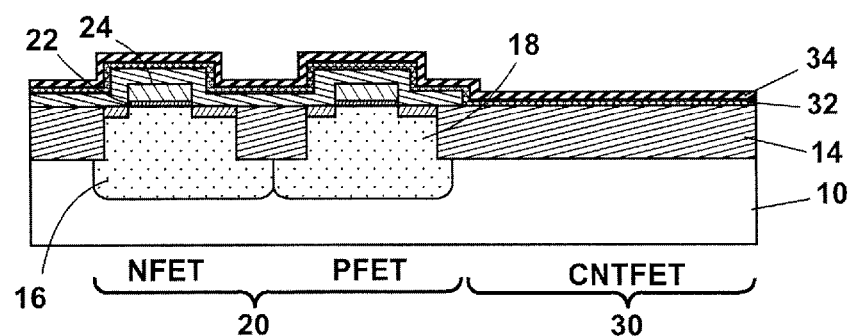
Figure 8:
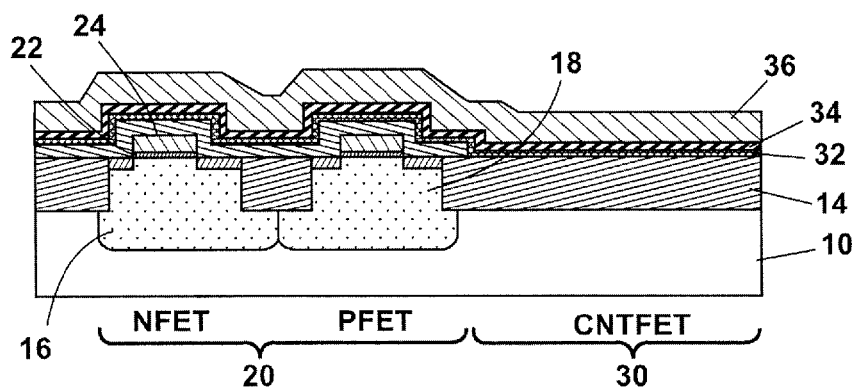
Figure 9:
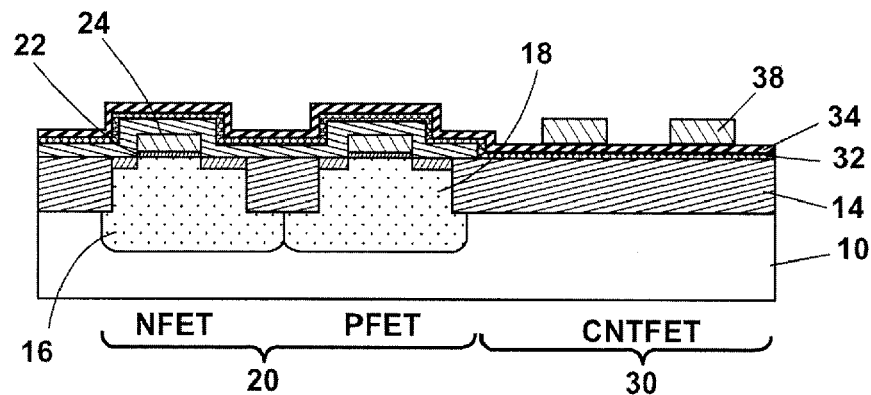
Figure 10:
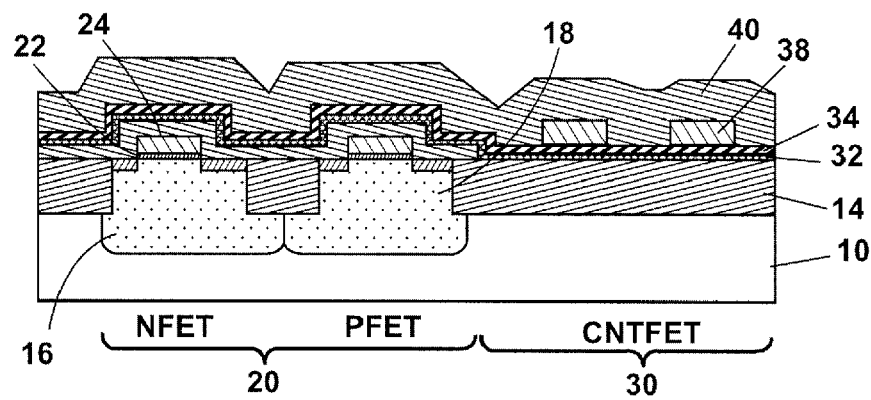
Figure 11:
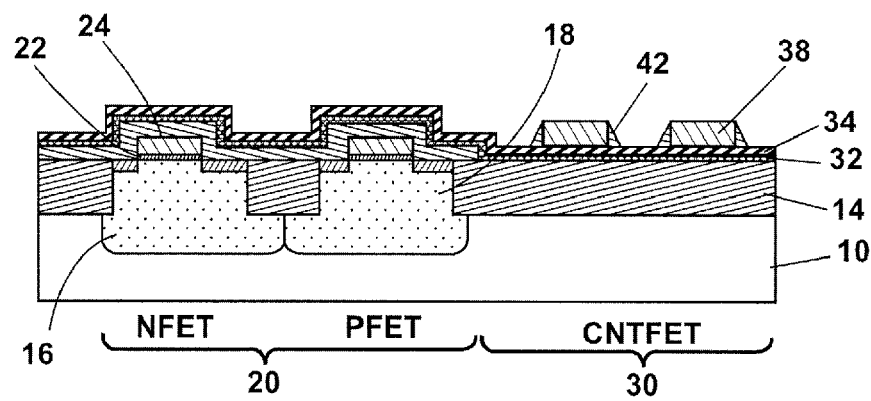

In one or more embodiments, a layer of nanotubes (e.g., CNTs) 32 is then deposited over the upper surface of the structure and a nanotube gate dielectric 34 is deposited over the layer of nanotubes 32, as illustrated in FIG. 7. The nanotube gate dielectric 34 serves as a protective layer for the nanotubes 32, while also serving as an etch stop for protecting the nanotubes 32 during subsequent etching procedures. The nanotube gate dielectric 34 further acts as a gate dielectric under gates for nanotube devices acting as FETs and as a passivation layer elsewhere. Any suitable gate deposition method may be employed, including but not limited to atomic layer deposition (ALD) of the nanotube gate dielectric 34. Further, any suitable gate dielectric material may be utilized, including but not limited to $Al_2O_3$, $HFO_2$, $ZrO_2$, $Si_xN_y$, etc. A nanotube gate electrode layer 36, such as polysilicon or a different conducting electrode material, is then deposited over the upper surface of the structure, as illustrated in FIG. 8. The nanotube gate electrode layer 36 is then patterned, such as by photolithographic patterning or other known patterning techniques, to form nanotube gate electrodes 38, as shown in FIG. 9. A nanotube spacer layer 40 is then deposited over at least the nanotube gate electrodes 38 or over the upper surface of the entire structure, as illustrated in FIG. 10. The nanotube spacer layer 40 is then etched to form nanotube spacers 42 on the side surfaces of the nanotube gate electrodes 38, as illustrated in FIG. 11. In one or more embodiments, the nanotube spacer layer 40 may comprise silicon oxide, silicon nitride, or any other spacer material known to those skilled in the art that is used in semiconductor manufacturing processes.

Figure 12:
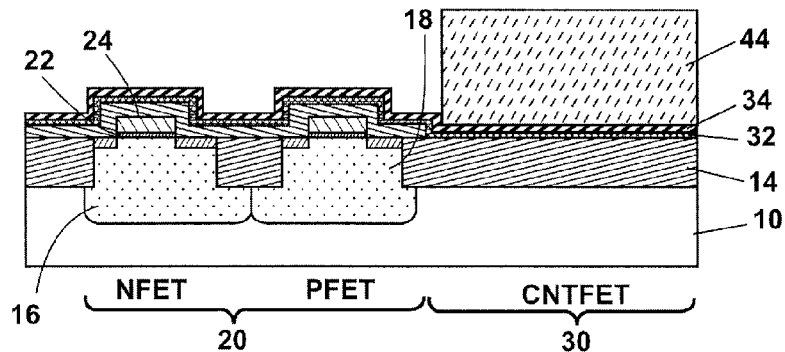
Figure 13:
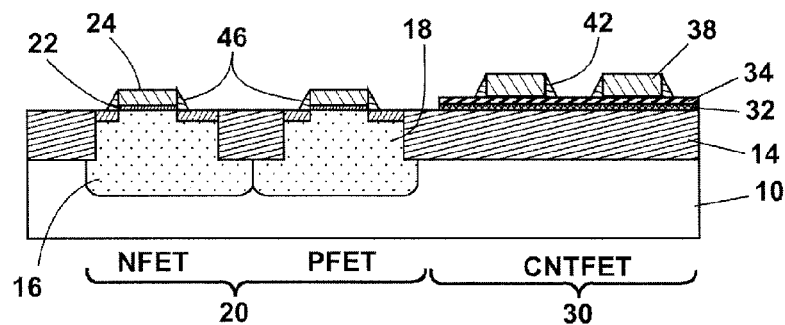
Figure 14:
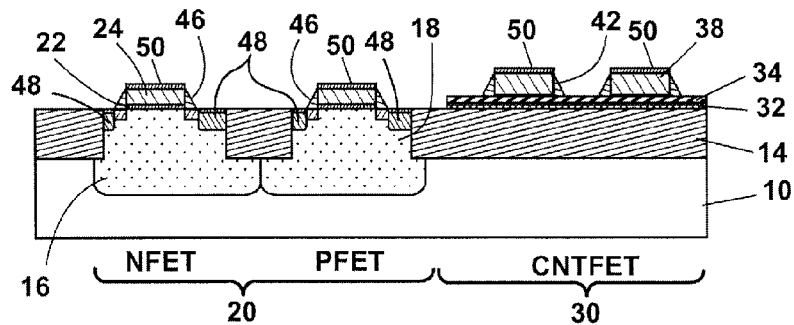

A photoresist 44 or other protective material is then formed over the entire nanotube region 30 to protect the CNT FET devices formed in the nanotube region 30 from subsequent procedures, as illustrated in FIG. 12. The layers of nanotubes 32 and nanotube gate dielectric 34 are then selectively removed from above the CMOS region 20 by etching or other similar procedures. The CMOS spacer material 26 is also selectively etched to form CMOS spacers 46 on the side surfaces of the CMOS gates 24, as illustrated in FIG. 13. The photoresist 44 is also removed from the nanotube region 30. Source and drain regions 48 are then formed in the NFET 16 and PFET 18 devices of the CMOS region 20 and salicide layers 50 are deposited over the surfaces of the CMOS gates 24 and the nanotube gate electrodes 38 using standard CMOS process techniques known to those skilled in the art, thereby resulting in the formation of an integrated nanotube and CMOS device 52 on the same wafer, as illustrated in FIG. 14.

In one or more embodiments, by utilizing the described method for integrating the formation of carbon nanotube (CNT) devices with a standard complementary metal oxide semiconductor (CMOS) process flow to form both CNT devices and CMOS devices on the same wafer, new avenues for commercializing a new generation of RF CMOS technology are created where superior RF/analog circuitry based on CNTs can be combined with digital circuitry based on standard silicon CMOS. This makes a true system-on-chip (SoC) feasible combining the strengths of nanotube electronics and silicon electronics.

While the system and method have been described in terms of what are presently considered to be specific embodiments, the disclosure need not be limited to the disclosed embodiments. It is intended to cover various modifications and similar arrangements included within the spirit and scope of the claims, the scope of which should be accorded the broadest interpretation so as to encompass all such modifications and similar structures. The present disclosure includes any and all embodiments of the following claims.

The invention claimed is:

1. A method, comprising:
   integrating the formation of nanotube devices into a complementary metal oxide semiconductor (CMOS) process flow to form nanotube devices in a nanotube region of a substrate and CMOS devices in a CMOS region of the same substrate that involves (i) protecting the CMOS region from certain nanotube fabrication processes while fabricating the nanotube devices and (ii) protecting the nanotube region from certain CMOS fabrication processes while fabricating the CMOS devices.

2. The method of claim 1, further comprising forming a carbon nanotube device and a CMOS device on the same wafer during the same CMOS process flow.

3. The method of claim 1, further comprising forming integrated nanotube and CMOS devices on the same substrate for system-on-chip (SoC) applications having RF/analog circuitry based on nanotube devices and digital circuitry based on CMOS devices.

4. A method, comprising:
   forming portions of a CMOS device in a CMOS region of a substrate including a CMOS gate and a spacer material covering at least the CMOS gate, wherein the substrate also include a nanotube region;
   depositing a layer of nanotubes over the CMOS region and the nanotube region;

depositing a layer of nanotube gate dielectric material over the layer of nanotubes;

forming nanotube gate electrodes on the nanotube gate dielectric material in the nanotube region;

forming spacers on opposing side surfaces of the nanotube gate electrodes;

forming a protective material resistant to etching over the nanotube region;

removing the layers of nanotubes and nanotube gate dielectric material in the CMOS region that is not covered by the protective material;

removing the protective material;

etching the spacer material in the CMOS region to form spacers on opposing side surfaces of the CMOS gates.

5. The method of claim 4, further comprising forming a salicide layer over surfaces of the CMOS gates and the nanotube gate electrodes.

6. The method of claim 4, wherein the nanotube gate electric serves as an etch stop for protecting the nanotubes during various removal procedures.

7. The method of claim 4, further comprising forming integrated nanotube and CMOS devices on the same substrate for system-on-chip (SoC) applications having RF/analog circuitry based on nanotube devices and digital circuitry based on CMOS devices.

8. The method of claim 4, wherein the nanotubes are carbon nanotubes.

9. The method of claim 4, wherein the substrate is a p-type silicon (p-Si) wafer.

10. The method of claim 4, wherein the portions of the CMOS device formed in the CMOS region further comprise:

forming NFET and PFET wells in the CMOS region of a substrate;

forming a gate oxide layer over a portion of each of the NFET and PFET wells in the CMOS region;

forming respective CMOS gates over the gate oxide layer in each of the NFET and PFET wells;

depositing the spacer material over an upper surface of the CMOS region and of a nanotube region on the substrate;

forming a CMOS protective material resistant to etching over the CMOS region;

removing the spacer material from the nanotube region; and removing the CMOS protective material.

* * * * *